United States Patent
Weimer et al.

(10) Patent No.: US 9,989,584 B2
(45) Date of Patent: Jun. 5, 2018

(54) CONTROLLING SIGNAL PATH INDUCTANCE IN AUTOMATIC TEST EQUIPMENT

(71) Applicant: Teradyne, Inc., North Reading, MA (US)

(72) Inventors: Jack E. Weimer, Gurnee, IL (US); Steven C. Price, Grayslake, IL (US); David R. Hanna, Chicago, IL (US); Jeffry Baenen, Waukegan, IL (US); Scott Skibinski, Zion, IL (US)

(73) Assignee: Teradyne, Inc., North Reading, MA (US)

( * ) Notice: Subject to any disclaimer, the term of this patent is extended or adjusted under 35 U.S.C. 154(b) by 296 days.

(21) Appl. No.: 14/329,617

(22) Filed: Jul. 11, 2014

(65) Prior Publication Data

US 2016/0011256 A1 Jan. 14, 2016

(51) Int. Cl.
*G01R 31/28* (2006.01)
*G01R 31/34* (2006.01)

(52) U.S. Cl.
CPC ..... *G01R 31/2834* (2013.01); *G01R 31/2839* (2013.01); *G01R 31/2879* (2013.01); *G01R 31/34* (2013.01)

(58) Field of Classification Search
None
See application file for complete search history.

(56) References Cited

U.S. PATENT DOCUMENTS

| | | | |
|---|---|---|---|
| 5,014,002 A | 5/1991 | Wiscombe et al. | |
| 6,252,177 B1* | 6/2001 | Stoddard | H05K 1/0231 361/306.2 |
| 6,556,034 B1* | 4/2003 | Johnson | G01R 31/31924 324/762.01 |
| 7,489,125 B2* | 2/2009 | Hauptman | G01R 35/005 324/750.02 |
| 2004/0022039 A1 | 2/2004 | Ortiz et al. | |
| 2007/0067066 A1* | 3/2007 | Niki | H01L 23/645 700/286 |
| 2007/0247178 A1 | 10/2007 | Dunklee et al. | |
| 2014/0183550 A1 | 7/2014 | Reusch et al. | |

FOREIGN PATENT DOCUMENTS

JP  2009-021280  1/2009

OTHER PUBLICATIONS

International Search Report and Written Opinion dated Oct. 22, 2015 in international application No. PCT/US2015/039547, 12 pgs.
Machine Translation of JP2009-021280 generated Jan. 21, 2016, 27 pgs.
International Preliminary Report on Patentability for PCT/US2015/039547, 8 pages dated (Jan. 17, 2017).

* cited by examiner

*Primary Examiner* — Vincent Q Nguyen
(74) *Attorney, Agent, or Firm* — Choate, Hall & Stewart LLP (57) ABSTRACT

Example automatic test equipment (ATE) may include: a device interface board (DIB) on which the DUT is mounted; a system for sending signals to, and receiving signals from, the DUT; and an energy source unit (ESU) to provide current to the DUT via the DIB, where the ESU includes current paths to provide the current, and where the current paths are configured to limit a combined inductance of the current paths.

20 Claims, 8 Drawing Sheets

CONTROLLING SIGNAL PATH INDUCTANCE IN AUTOMATIC TEST EQUIPMENT

TECHNICAL FIELD

This specification relates generally to controlling signal path inductance in automatic test equipment.

BACKGROUND

Automatic Test Equipment (ATE) refers to an automated, usually computer-driven, system for testing devices. A device tested by ATE is generally referred to as a device under test (DUT). ATE typically includes a computer system and a test instrument or a single device having corresponding functionality. ATE is capable of providing test signals to a DUT, receiving response signals from the DUT, and forwarding those response signals for processing to determine whether the DUT meets testing qualifications.

SUMMARY

Example automatic test equipment (ATE) may comprise: a device interface board (DIB) on which the DUT is mounted; a system for sending signals to, and receiving signals from, the DUT; and an energy source unit (ESU) to provide current to the DUT via the DIB, where the ESU may comprise current paths to provide the current, and where the current paths may be configured to limit a combined inductance of the current paths. The example ATE may comprise one or more of the following features, either alone or in combination.

The current paths may comprise a first circuit path and a second circuit path, the first circuit path may be for passing first current resulting in a first magnetic field, and the second circuit path may be for passing second current resulting in a second magnetic field that at least partially cancels the first magnetic field. The first current may be substantially equal in magnitude, and opposite in direction, to the second current. In some implementations, the ESU may be located directly below the DIB. In some implementations, The ESU may be located below the DIB (though not directly below), and in a position that reduces inductance in the current paths without having a significant adverse impact on testing performed on the DUT.

The current paths may comprise a first circuit path and a second circuit path, the first circuit path may be for passing first current resulting in a first magnetic field, and the second circuit path may be for passing second current resulting in a second magnetic field that at least partially cancels the first magnetic field. The first circuit path may comprise multiple first conductive planes, and the second circuit path may comprise multiple second conductive planes, where the first conductive planes and the second conductive planes are in parallel. Each one of at least some of the first conductive planes may be arranged between two second conductive planes such that first conductive planes and second conductive planes are interleaved.

The ATE may comprise a quick disconnect (QD) between the ESU and the DIB. The QD may be for disengaging the ESU from the DIB. The QD may form at least part of an electrical connection between the DUT and the ESU. The QD may comprise a first circuit path and a second circuit path, the first circuit path may be for passing first current resulting in a first magnetic field, and the second circuit path may be for passing second current resulting in a second magnetic field that at least partially cancels the first magnetic field. The ESU may comprise: one or more capacitors for providing current to the DUT; and switches, arranged in parallel, between the one or more capacitors and the DIB, where the switches are configured to open in response to a current that exceeds a specified value. The switches may comprise multiple solid state switches, which are numbered (e.g., there are an appropriate number of switches) to achieve an inductance below a specified value.

The circuit paths may comprise multiple first conductive planes and multiple second conductive planes, where the first conductive planes and the second conductive planes are in parallel, where the first conductive planes are interrupted by a gap, and where the switches breach the gap so as to pass current between different portions of the first conductive planes. The switches may be at least greater than a predetermined distance from the one or more capacitors.

An example apparatus for interfacing between automatic test equipment (ATE) and a device under test (DUT) may comprise: a device interface board (DIB) on which the DUT is mounted; and an energy source unit (ESU) to provide current to the DUT. The ESU may comprise a circuit board that forms at least part of an electrical connection between the DUT and the ESU. The circuit board may comprise a first circuit path and a second circuit path, the first circuit path may be for passing first current resulting in a first magnetic field, and the second circuit path may be for passing second current resulting in a second magnetic field that at least partially cancels the first magnetic field. The example apparatus may comprise one or more of the following features, either alone or in combination.

The first current may be substantially equal in magnitude, and opposite in direction, to the second current. The ESU may be located directly below the DIB relative to the DUT. The ESU may be located below the DIB (though not directly below), and in a position that reduces inductance in the first path without having a significant adverse impact on testing performed on the DUT. The first circuit path may comprise multiple first conductive planes, the second circuit path may comprise multiple second conductive planes, and the first conductive planes and the second conductive planes may be in parallel. Each one of at least some of the first conductive planes may be arranged between two second conductive planes.

The apparatus may comprise a quick disconnect (QD) between the ESU and the DIB. The QD may before disengaging the ESU from the DIB. The QD may form at least part of the electrical connection between the DUT and the ESU. The QD may comprise a third circuit path and a fourth circuit path. The third circuit path may be for passing third current resulting in a third magnetic field and the fourth circuit path may be for passing fourth current resulting in a fourth magnetic field that at least partially cancels the third magnetic field.

The ESU may comprise: one or more capacitors for providing current to the DUT; and switches, arranged in parallel, between the one or more capacitors and the DUT, where the switches are configured to open in response to a current that exceeds a specified value. The switches may comprise multiple solid state switches, numbered (e.g., there are an appropriate number of switches) to achieve an inductance below a specified value.

The first circuit path may comprise multiple first conductive planes, the second circuit path may comprise multiple second conductive planes, the first conductive planes and the second conductive planes may be in parallel, the first conductive planes may be interrupted by a gap, and the switches may breach the gap so as to pass current between different portions of the first conductive planes. The switches may be at least greater than a predetermined distance from the one or more capacitors.

Any two or more of the features described in this specification, including in this summary section, can be combined to form implementations not specifically described herein.

The test systems and techniques described herein, or portions thereof, can be implemented as/controlled by a computer program product that includes instructions that are stored on one or more non-transitory machine-readable storage media, and that are executable on one or more processing devices to control (e.g., coordinate) the operations described herein. The test systems and techniques described herein, or portions thereof, can be implemented as an apparatus, method, or electronic system that can include one or more processing devices and memory to store executable instructions to implement various operations.

The details of one or more implementations are set forth in the accompanying drawings and the description below. Other features and advantages will be apparent from the description and drawings, and from the claims.

DESCRIPTION OF THE DRAWINGS

Like reference numerals in different figures indicate like elements.

DETAILED DESCRIPTION

To test components, manufacturers commonly use ATE (or "testers"). In response to instructions in a test program set (TPS), some ATE automatically generates input signals to be applied to a device under test (DUT), and monitors output signals. The ATE compares the output signals with expected responses to determine whether the DUT is defective. ATE typically includes a computer system and a test instrument or a single device having corresponding functionalities. In some cases, the test instrument provides power to a DUT.

Also typically included with ATE is an interface, which may, or may not, be part of a device interface board (DIB). The interface may be configured (e.g., include one or more interfaces) to route signals between the ATE and one or more DUTs. In some implementations, the interface is configured to route signals between one or more ATE and one or more DUTs. In some cases, the interface includes one or more drivers to drive signals to the DUT(s). In this context, a driver generally refers to any type of circuitry that outputs an electrical signal. For example, a logic gate (e.g., an AND gate, an OR gate, etc.), a splitter, an amplifier, or the like, may all be considered drivers because they output signals.

Examples of devices that may be tested using ATE include electric motors and the motor drives that power those electric motors. Such electric motors and motor drives may be used, e.g., in electric and hybrid electric automobiles to augment or eliminate an internal combustion engine. The components that make up electronic motor drives may include IGBTs (Insulated Gate Bipolar Transistor) built in an H-bridge configuration. The IGBTs are used for rapid switching, providing pulsed power to the windings of the motor. With proper control, AC motors can operate efficiently across a wide range of speeds and operating conditions.

Production testing is part of the manufacturing process for motor drive components. In some implementations, test systems (e.g., ATE) for these devices provide complete AC (Alternative Current) and DC (Direct Current) test capability covering voltages ranging beyond 1500 VDC and currents beyond 5000 A. Dynamic/AC testing can be challenging due to its specialized nature. In some cases, such testing may use an energy source that can deliver several hundred amperes of current in 100 ns or less, while operating at voltages above 1 kV.

Described herein are examples of ATE for use with production AC motor drive device testing. In some implementations, the ATE includes a general purpose test system and a DIB that can be relatively quickly and easily removed/replaced while maintaining relatively low electrical signal path inductance. In some implementations, the path inductance of the ATE is kept relatively low (e.g., <100 nH) to reduce the possibility of inductive kicks that can damage or destroy a DUT. As described below, the path inductance includes inductance along a current path between an energy supply and the DIB or DUT. In some implementations, relatively low path inductance may include an inductance that is less than 100 nH; however, in other implementations, what constitutes "relatively low path inductance may differ, e.g., <50 nH, <200 nH, <300 nH, <400 nH, and so forth.

The example ATE described herein is modular and is supported with built-in module level self-test and calibration. Modules may be installed or replaced with relative ease. In some implementations, the ATE also may include a standardized general purpose DIB, which allows customers to change between one test application and other test applications. Systems are also supported with a programming environment with specialized editing and debug tools.

In some implementations, the example ATE described herein can meet the demands of relatively high switching power, low inductance, and a replaceable DIB. One feature of the ATE relates to the electromechanical orientation of the Energy Source Unit (ESU) used to provide power (current) to the DIB/DUT via one or more current pathways (which are described in more detail below). In some implementations, the ATE is structured to locate the ESU directly under the DIB to reduce (e.g., to minimize) the connection path distance. The connection path distance includes, e.g., the electrical path length between the ESU and the DUT or the DIB. In addition, in some implementations, field cancellation techniques and knowledge of material properties are used to reduce (e.g., to minimize) the path inductance between the ESU and the DIB/DUT.

Figure 1:
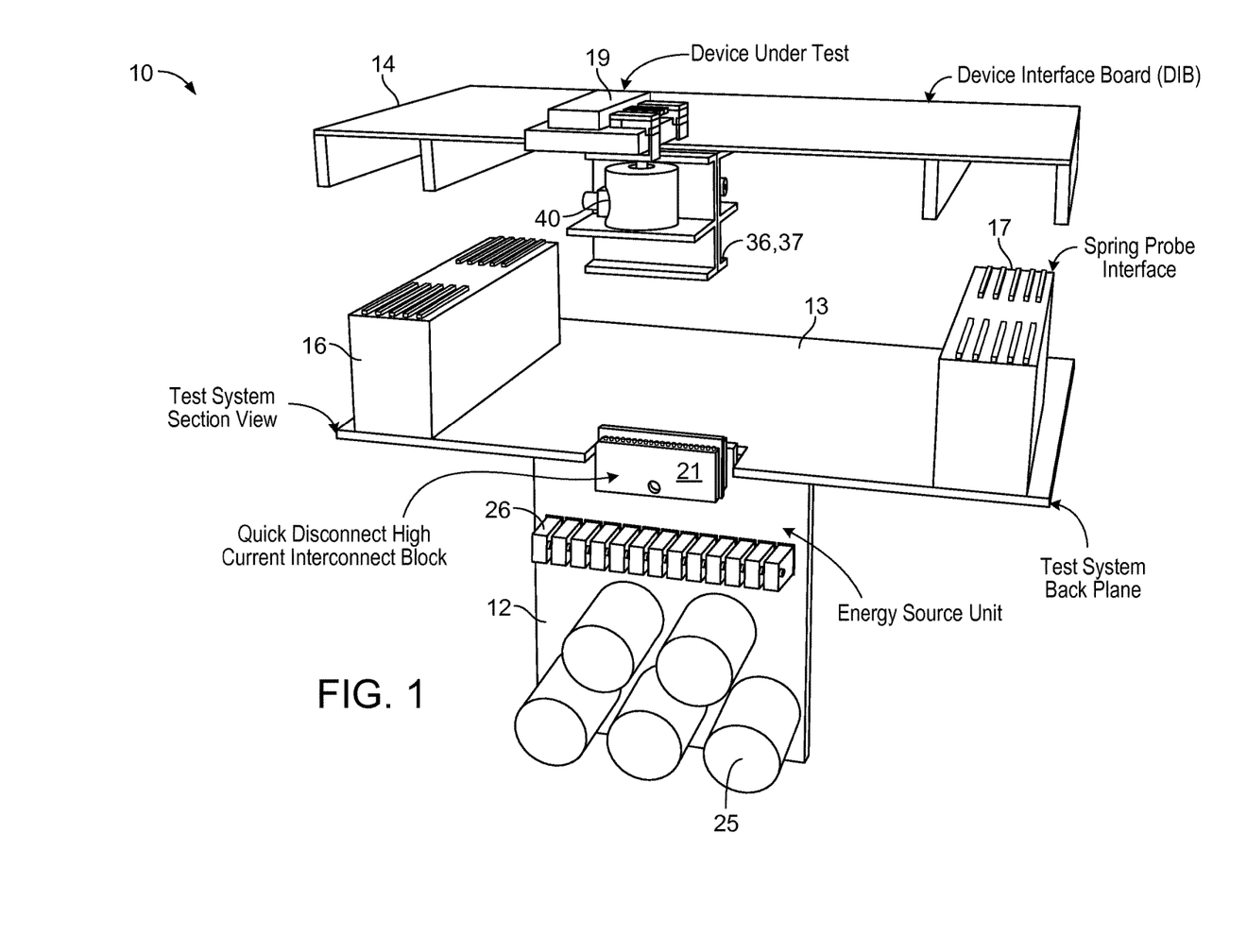
FIG. 1 is a perspective view of example components of ATE, including an energy source unit (ESU) and device interface board (DIB) disconnected.
Figure 2:
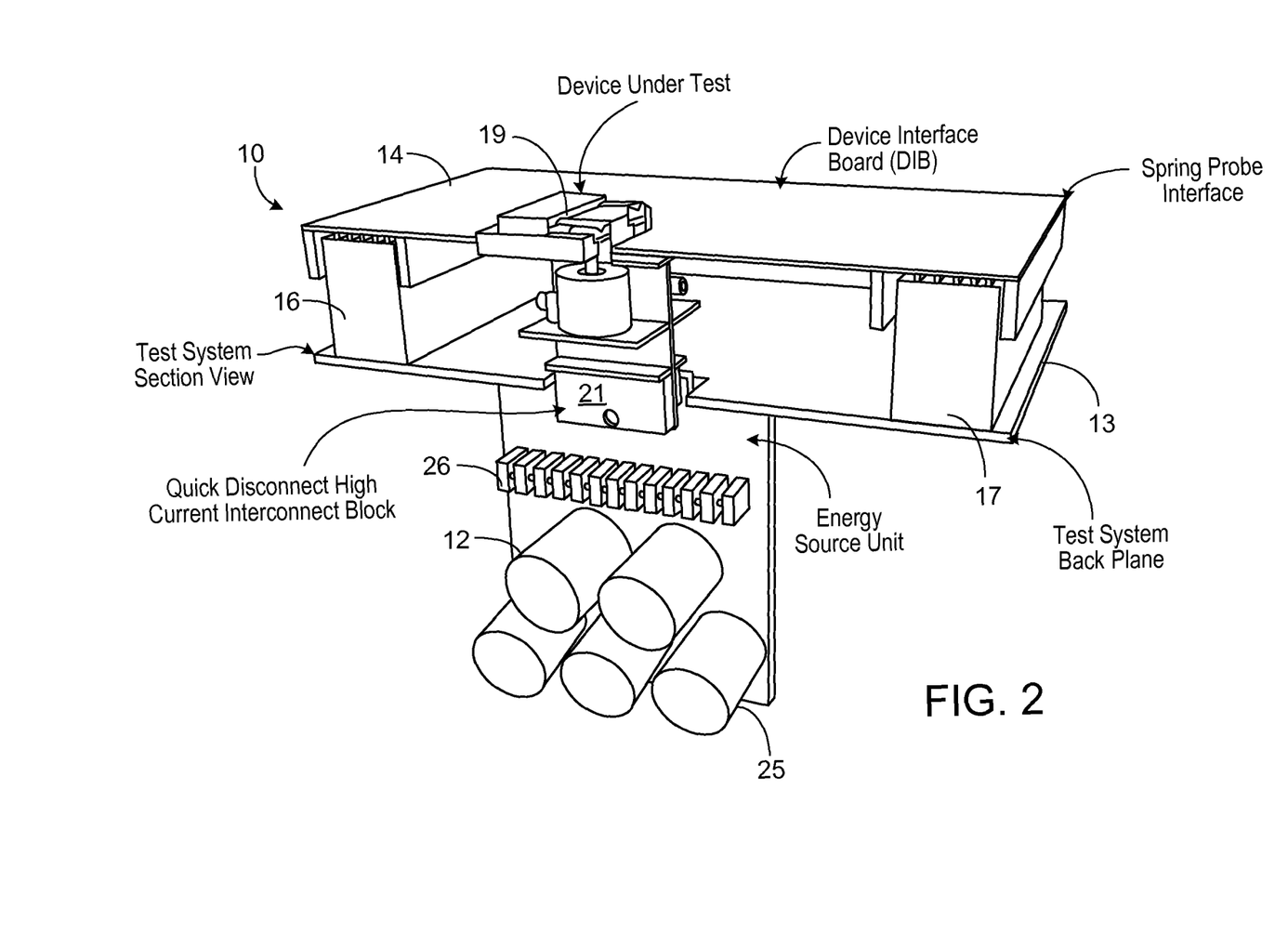
FIG. 2 is a perspective view of example components of ATE, including an ESU and a DIB connected together.

FIGS. 1 and 2 illustrate perspective views of example ATE 10 described herein, which includes an ESU 12, a system backplane 13, and a removable device DIB 14. FIG. 1 shows the DIB disconnected from system backplane 13 and FIG. 2 shows DIB 14 connected to system backplane 13.

In some implementations, all electrical connections to/from the DIB are made via arrays of spring loaded connection pins at interfaces 16, 17, which enable the removal/replacement of DIB for rapid change over from one test application to another.

DIB supports a DUT 19, as shown. In this example implementation DUT 19 may include one or more electric motors and the motor drives that power those electric motors. However, in other implementations, different DUTs may be used.

In example ATE 10, ESU 12 is located vertically and directly under/beneath DIB 14 and DUT 19. This configuration can reduce electrical path length between the ESU and the DIB/DUT. That is, because the ESU is located relatively close to the DIB, the current path between the ESU and the DIB (or DUT) can be made relatively short, resulting in an inductance that is lower than that for longer path lengths. Components of the ESU are arranged in a position that reduces inductance in the current paths without having an adverse impact on testing performed on the DUT. In some implementations, ESU 12 is located under/beneath DIB 14 and DUT 19, but not directly under/beneath DIB 14 and DUT 19. In some implementations, ESU 12 may be located on the DIB itself.

In some cases, DIB designers prefer the flexibility to locate test sockets (to which DUTs interface) as needed for interfacing to automated handlers or probers. In some implementations, the ESU connections are located well below the surface of the DIB, which provides interconnection location flexibility, yet provides a relatively short path (e.g., the shortest path) to the test socket. The vertical distance between high current interconnect block 21 interfacing the ESU and the DIB (described below) and the bottom side of the DIB's printed circuit board (PCB) 22 is also used for locating certain DIB based components used for testing, as shown. This arrangement can be advantageous in that it may provide flexibility to locate test sockets appropriately for interfacing with other equipment, while maintaining a relatively low inductance connection path back to the ESU.

In some implementations, the large physical size of ESU 12 (which may include one or more capacitors/capacitor banks 25 and other circuitry)) and its central location within test system backplane 13 dictates that test instruments (not shown) be located away from the center of the backplane. Their signals pass through the spring probes located at the periphery of DIB 14. In various implementations, these signals can tolerate possible higher resistance, higher inductance, and longer path length without significant signal quality degradation.

Figure 3:
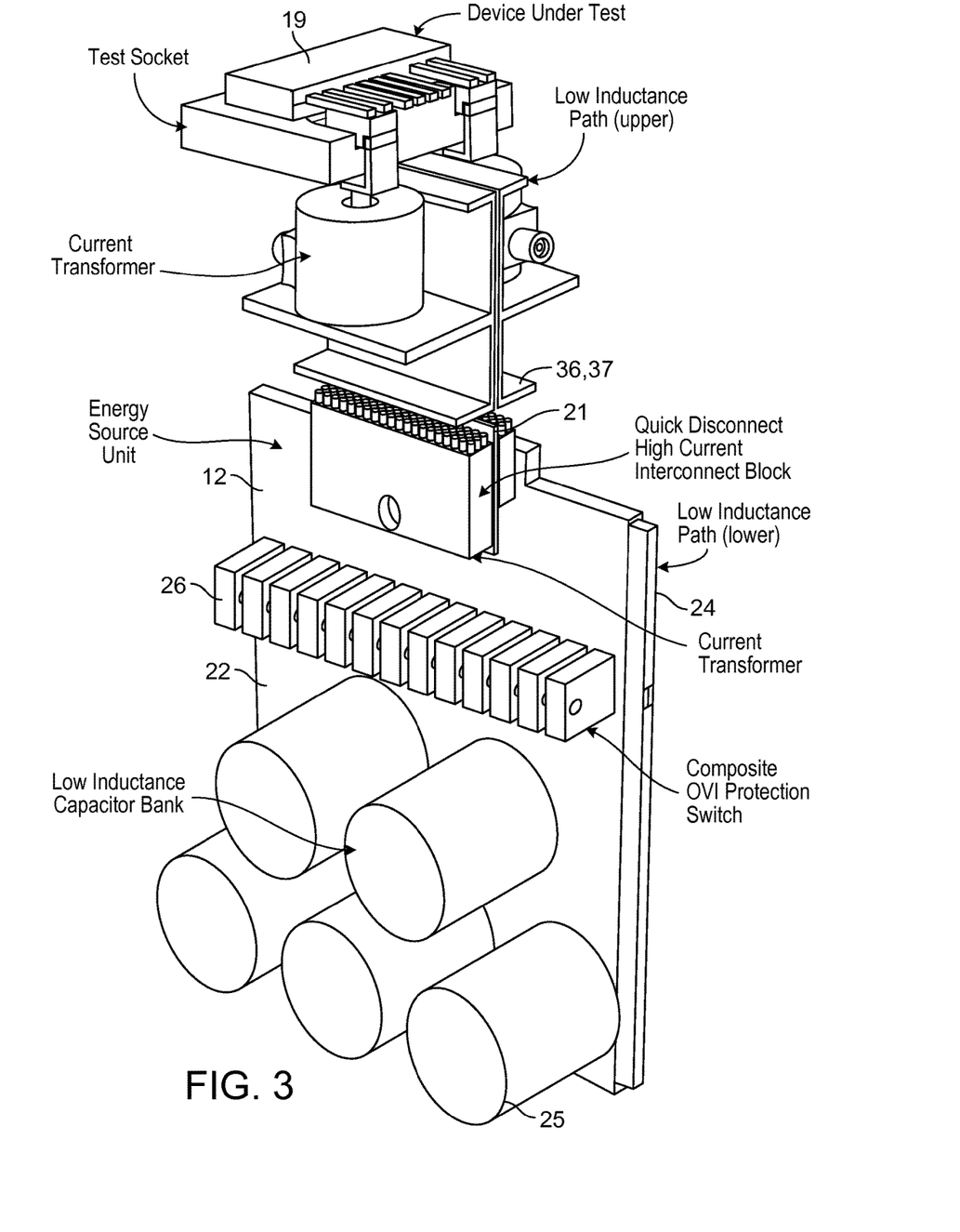
FIG. 3 is a perspective view of an example ESU and example parts of a DIB.

Referring to FIG. 3, features of example ESU 12 include a PCB 22 incorporating a relatively low inductance path 24 (described below), a bank of energy storage capacitors 25, a composite self-protection switch 26, and a low inductance, high current interconnect block 21. In this example implementation, these elements are arranged to meet both the electrical and mechanical testing requirements of a general purpose motor drive test system, e.g., DUT 19. In some cases, this example system can deliver an effective total round trip interconnect inductance of less than 100 nH, 90 nH, 70 nH, etc.

Figure 4:
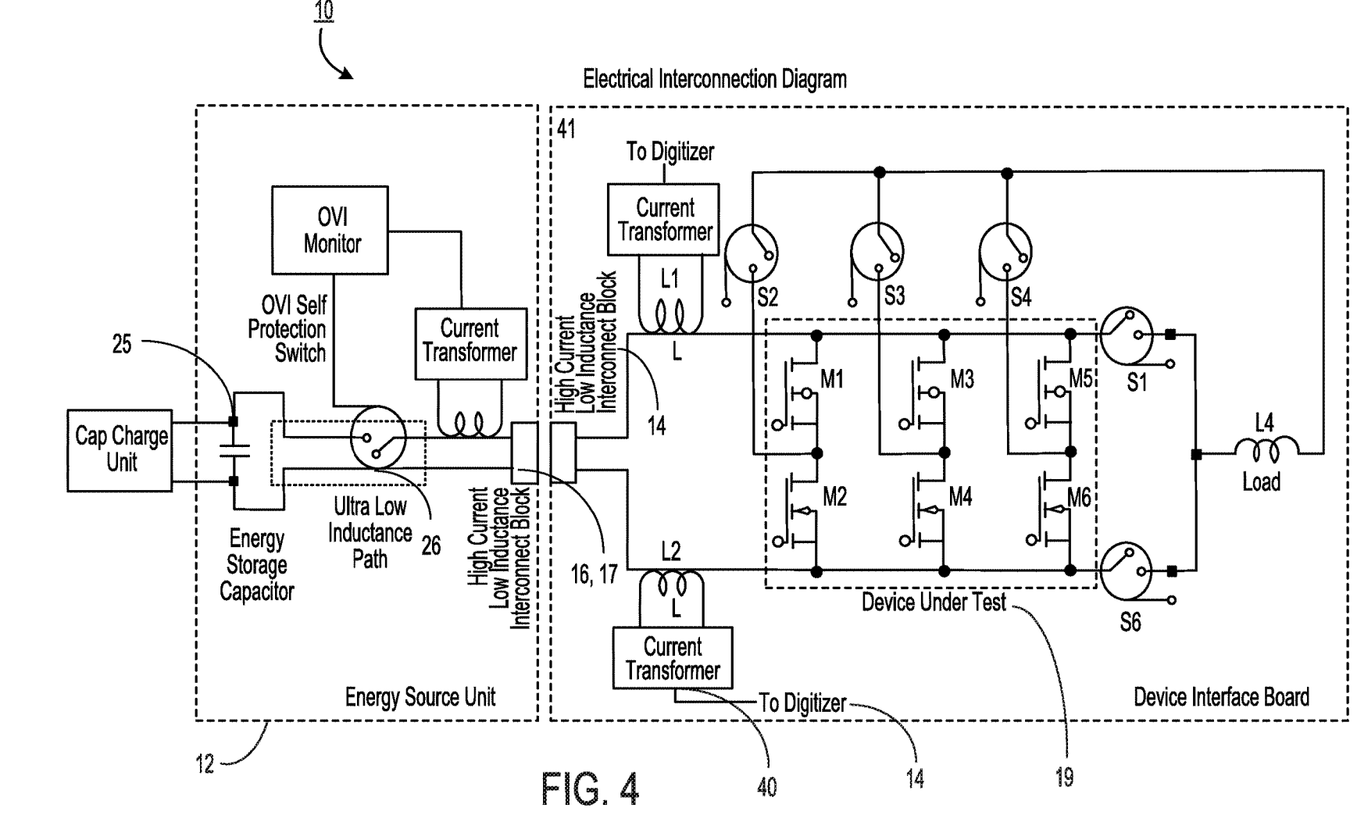
FIG. 4 is a circuit diagram showing example circuitry for an ATE.

FIG. 4 shows an example circuit diagram of ATE 10 that includes example ESU 12 and example DIB 14 containing example DUT 19. As shown in FIG. 4, the electrical signal (current) path length between the large value energy storage capacitors 25 of the ESU and the DUT 19 contains a number of elements that could threaten to increase path inductance beyond specified design criteria. In this regard, inductance typically increases by 16 to 20 nH per inch of conductor for non-field cancelling signal paths. In order to at least partly address these potential obstacles, the internal layers of PCB 22 include an interleaved arrangement of conductive (e.g., copper) plates/planes, where several positive (P) polarity plane layers are interleaved with several negative (N) plane layers. The interleaving of planes use relatively tight physical geometry to create a structure in which the magnetic fields generated by equal and opposite current flow through the different plane layers reduces inductance during high speed AC test execution, yielding a relatively low (e.g., ultra-low) inductance electrical signal path between the ESU and DUT/DIB.

Figure 5:
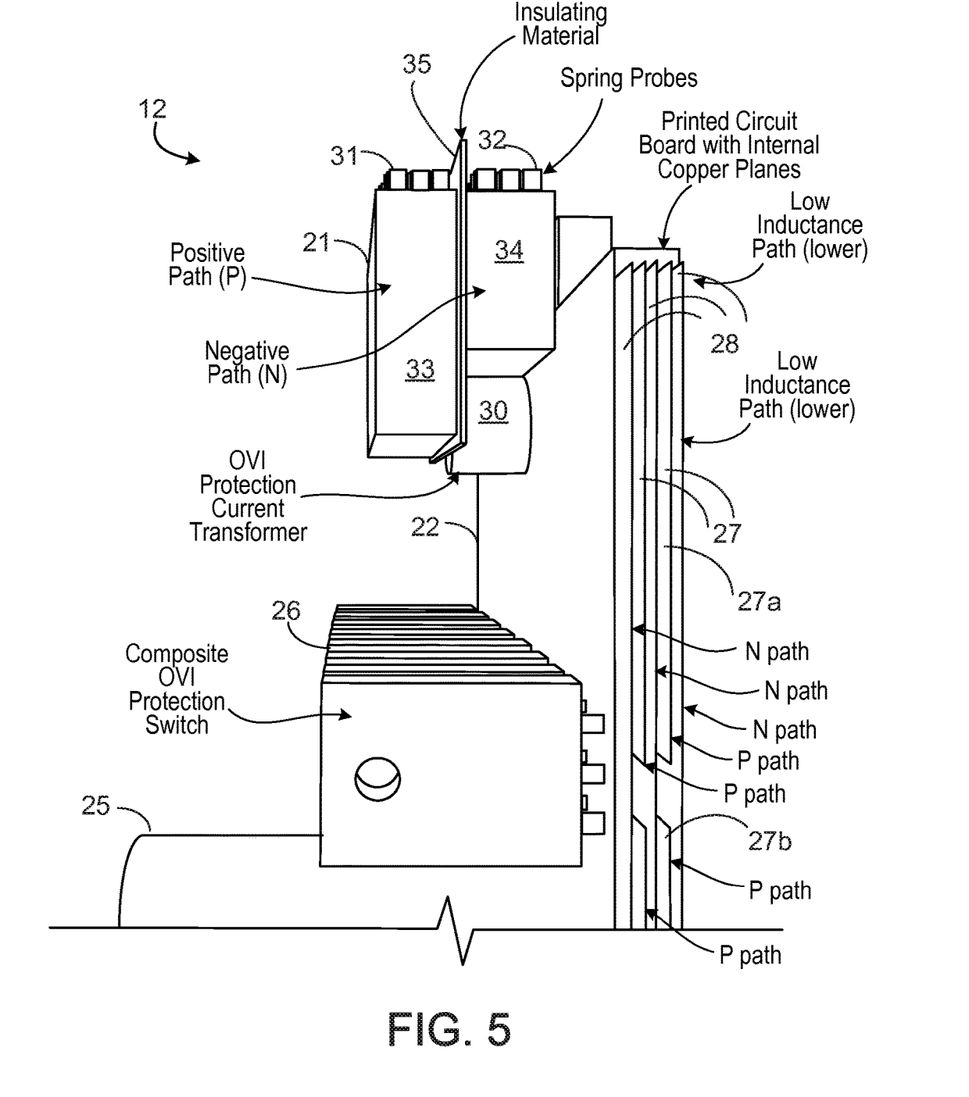
FIGS. 5 and 6 are perspective views of an ESU, including a cut-away portion of a printed circuit board (PCB) containing positive and negative current plane paths.
Figure 6:
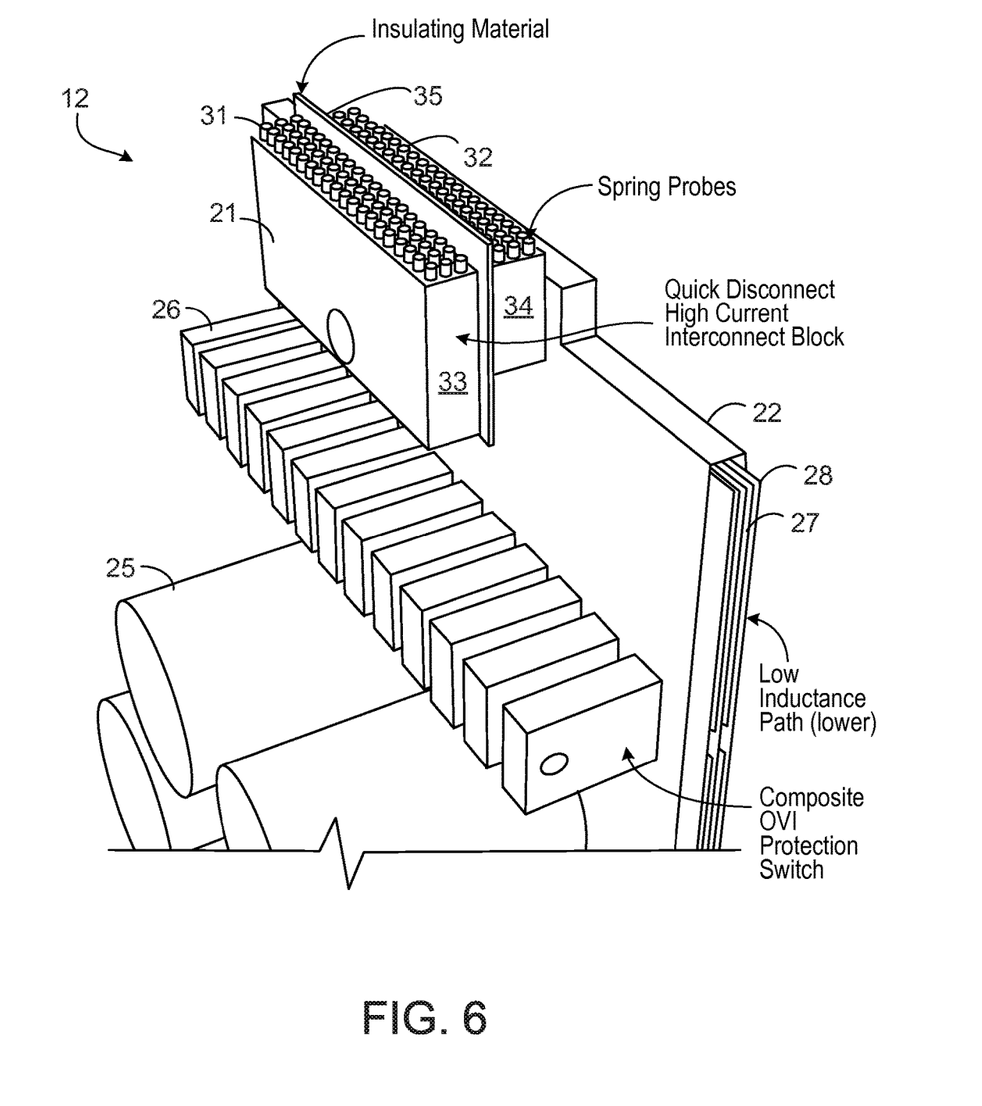

FIGS. 5 and 6 show examples of the P planes 27 and the N planes 28. In this example implementation, the P planes are used to pass current from the capacitors to the DIB/DUT, and the N planes are used as a return path. In more detail, in the example implementation of FIG. 5, the current paths include a drive circuit path (P) and a return circuit path (N). The drive circuit path is for passing first current to the DIB/DUT that results in a first magnetic field and the return circuit path is for passing second current from the DIB/DUT resulting in a second magnetic field. The second magnetic field at least partially cancels the first magnetic field and, in some implementations, cancels all of, or substantially all of, the first magnetic field, thereby reducing the inductance in the current path through field cancellation, as described below. By way of example, in many implementations the cancellation is not total, but if cancellation is better than 90%, then the 16 to 20 nH/inch inductance in an electrical signal path may be reduced to 1.6 to 2 nH/inch.

In this example implementation, the drive circuit path comprises multiple first conductive planes (P) 27, and the return circuit path comprise multiple second conductive planes (N) 28. The P and the N conductive planes are arranged in parallel or substantially in parallel and are interleaved or interdigitated. In the example of FIG. 5, each one of at least some of the P conductive planes is arranged between two N conductive planes such that P conductive planes and N conductive planes are interleaved. In other implementations, each one of at least some of the N conductive planes is arranged between two P conductive planes such that P conductive planes and N conductive planes are interleaved. For reasons explained below, in some implementations, each P plane 27 may be split into two portions, e.g., 27a and 27b (FIG. 5), that are bridged by switches 26.

In some implementations, the current through the N planes is equal in magnitude, and opposite in direction from, the current through the P planes. In some implementations, the current through the N planes is different in magnitude, and opposite in direction from, the current through the P planes.

A property associated with field cancellation is that current tends to take the path of least resistance. Therefore, as current flows in the interleaved P and N planes, the current naturally self-aligns to flow in an advantageous (e.g., optimal) way, thereby creating the path of least resistance through field cancellation.

Due to the nature of production testing, devices may not function or may fail during testing. In some examples, failing devices will be shorted, which can lead to excessive current flow in the ATE and may cause system damage. For this reason, in some implementations, the ESU includes an over current (OVI) self-protection monitor and disconnect (or "self-protection") switch 26 to detect excessive current and to inhibit current flow. In some implementations, due to potential extreme performance requirements, the switch is implemented using a number of high-current solid state power switches arranged in parallel. By creating a linear break/gap in each P plane and by locating the power switches in parallel bridging the gap in the P plane, there may be a reduced impact on field cancelation and the associated path inductance over the short distance of the switch area. In some implementations, the switches 26 are arranged in parallel between the one or more capacitors and the DIB, and the switches are configured to open in response to a current that exceeds a specified value. The switches may include multiple solid state switches, as indicated above. The number of such switches used may be selected to achieve an inductance below a specified/predetermined value (the more switches in parallel, the less the total inductance). In some implementations, the switches are located at least a predefined distance from the capacitor bank 25.

A current transformer 30 (FIG. 5) is one way to measure/monitor current flow in a high-speed test circuit of the type described herein. Its output is then fed to current monitor circuitry (not shown), where comparators are used to trigger (e.g., close) the self-protection switches 26 when necessary and to open them in response to an event or condition. In order to reduce the disruption in field cancellation, in some implementations, current transformer 30 is physically located to reduce non-field canceling signal (e.g., current) path length. In some implementations, high current interconnect block 21 is lengthened to allow current to be routed through the current transformer and down into the P plane layers of the PCB.

In some implementations, high current interconnect block 21 is a custom-made aluminum block set that houses two sets 31, 32 of spring probes arranged in sub-blocks 33, 34. High current interconnect block 21 allows for connection/disconnection of the ESU and DIB. In some implementations, sub-blocks 33 and 34 are isolated electrically from each other using a high voltage insulating material 35 to avoid potential arcing between the P and N signal paths since (in some implementations) the voltage difference there can exceed 1 kV. By using a relatively large number of spring probes in a relatively wide parallel pattern, contact resistance and inductance can be reduced. The close proximity of the blocks provides additional opportunity for field cancellation.

As in the ESU PCB, in this example, in high current interconnect block 21 the drive circuit path comprises multiple first conductive planes (P) (not shown), and the return circuit path comprise multiple second conductive planes (N) (not shown). The P and the N conductive planes are arranged in parallel or substantially in parallel and are interleaved or interdigitated, as in the PCB. In some implementations, each one of at least some of the P conductive planes is arranged between two N conductive planes such that P conductive planes and N conductive planes are interleaved. In other implementations, each one of at least some of the N conductive planes is arranged between two P conductive planes such that P conductive planes and N conductive planes are interleaved.

High current interconnect block 21 may be a quick disconnect (QD) between the ESU and the DIB, which is for disengaging the ESU from the DIB, and which forms at least part of an electrical connection between the DUT and the ESU. By virtue of the P and N planes, the QD thus includes a first circuit path (the P path) and a second circuit path (the N path), where the first circuit path is for passing first current resulting in a first magnetic field and the second circuit path is for passing second current resulting in a second magnetic field that at least partially (and, in some cases, totally) cancels the first magnetic field.

As explained above, the DIB is where the DUT and the test socket(s) are located. Production testing may involves interfacing the DUT with some type of automatic handling equipment. For this reason, test socket DIB locations are often dictated by the standardized docking structures used for mating the test system with the handling equipment. Because of the desire to reduce connection path length while maintaining test socket location flexibility, the high current connection point may be located well below the level of the DIB PCB in this example implementation.

Figure 7:
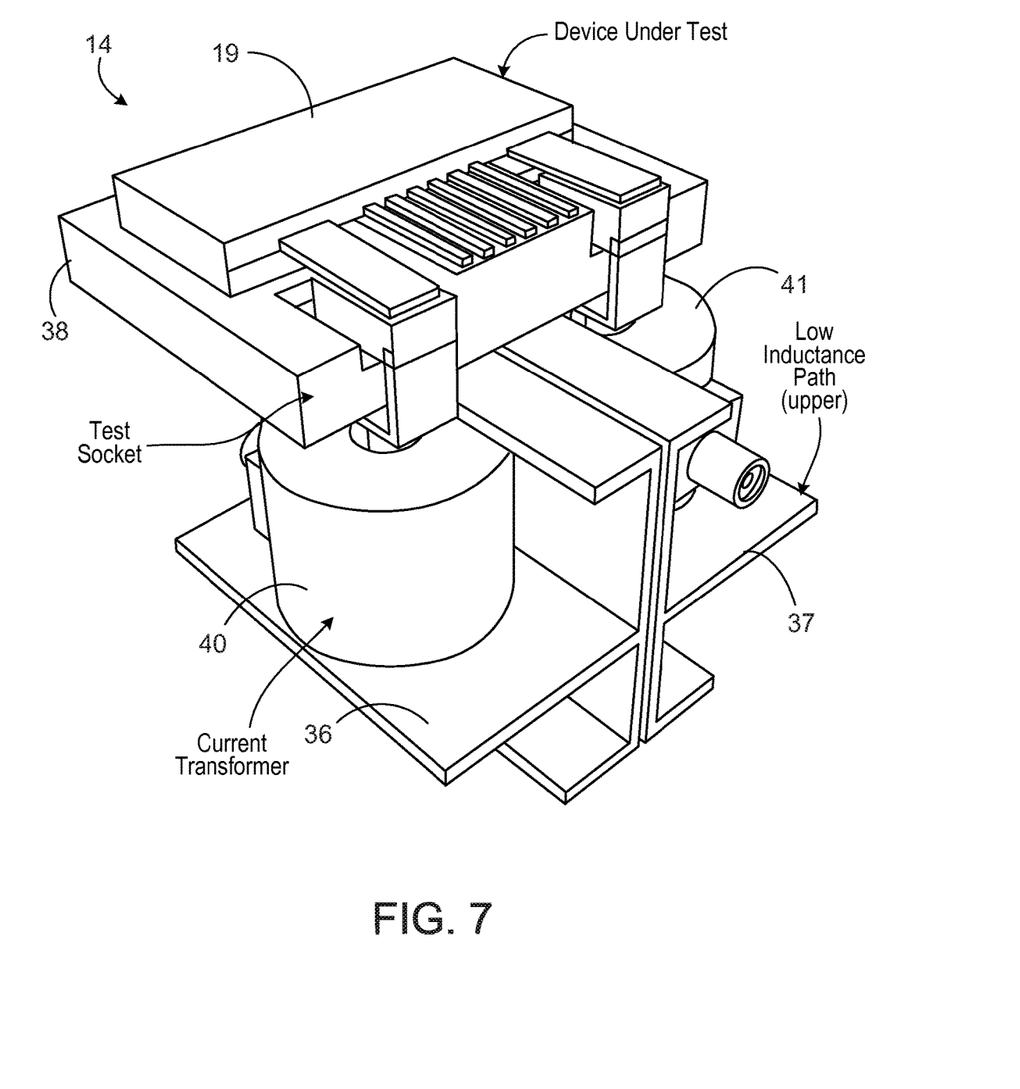
FIG. 7 is a perspective view of a DIB socket containing a DUT and part of the electrical signal path between the DIB and the ESU.

Referring to the example of FIG. 7, an example implementation is shown, which includes DUT 19 and test socket 38. In this example implementation, copper structures 36, 37 are configured to provide a wide low inductance connection path that incorporates field cancellation. In some implementations, there may be an insulating material (not shown) between the two copper structures. The copper structures are affixed to the DIB and may be independently attached to the frame members of the DIB for dimensional accuracy and stability. In some implementations, conductive materials other than copper may be used for the structures. As also shown the electrical test diagram of FIG. 4, current transformers 40, 41 are used for measuring switching current during the testing process. The location of these transformers may include signal paths that are non-field cancelling, so reducing their path length reduces overall path length inductance.

Features of the example implementations described herein thus may include one or more of the following. The perpendicular orientation of the ESU directly under the DIB within a general purpose ATE system may provide a shortest path length for relatively low inductance interfacing to the DUT. The relatively low inductance connection path incorporated into the ESU mother board with interleaved planes and integrated self-protection switch may provide functionality used for AC testing while maintaining a relatively reduced path inductance. The high current low inductance connection block may allow quick replacement of the DIB in the context of AC motor drive testing and within a semiconductor test system.

Figure 8:
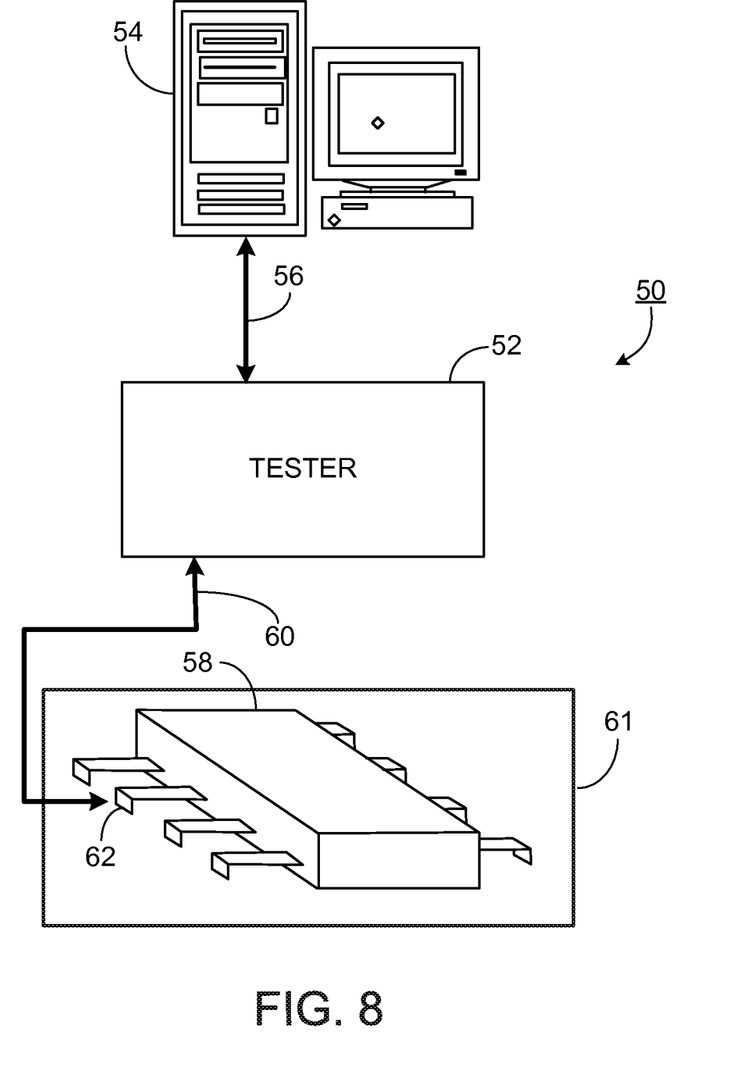
FIG. 8 is a block diagram of example components of ATE.

Referring to FIG. 8, an example ATE system 50 for testing a DUT 58, such as those described herein, includes a tester (or "test instrument") 52. DUT 58 may be interfaced to a DIB 60 (which is an example implementation of DIB 14 above), which may interface to an ESU of the type described herein (e.g., ESU 12). The interface between the DIB of FIG. 8 and the ESU may include the features of FIGS. 1 to 7 for controlling (e.g., limiting or reducing) signal path-length inductance.

Tester 52 may include a number of channels. To control tester 52, system 50 includes a computer system 54 that interfaces with tester 52 over a hardwire connection 56. In an example operation, computer system 54 sends commands to tester 52 to initiate execution of routines and functions for testing DUT 58. Such executing test routines may initiate the generation and transmission of test signals to the DUT 58 and collect responses from the DUT. Various types of DUTs may be tested by system 50. For example, DUTs may be an electric motor, one or more components thereof, and/or a motor drive that power the electric motors. For example, some motor drive parts are single IGBT, some are dual, some are quad and some are six or more IGBTs in a package. In some implementations, the DUT may be any appropriate semiconductor or other device, such as an integrated circuit (IC) chip (e.g., memory chip, microprocessor, analog-to-digital converter, digital-to-analog converter, etc.) or other devices.

To provide test signals and collect responses from the DUT, tester 52 is connected to an interface to the internal circuitry of DUT 58. For example, the DUT may be inserted into a socket (e.g., socket 38 of FIG. 7) in DIB 61, which contains interfaces to electrical connections between the DUT and the tester. A conductor 60 (e.g., one or more conductive pathways) is connected to the interface and is used to deliver test signals (e.g., switching or DC test signals, etc.) to the internal circuitry of DUT 58. Conductor 60 also senses signals in response to the test signals provided by tester 52. For example, a voltage signal or a current signal may be sensed at pin 62 in response to a test signal and sent over conductor 60 to tester 52 for analysis. Such single port tests may also be performed on other pins included in DUT 58. For example, tester 52 may provide test signals to other pins and collect associated signals reflected back over conductors (that deliver the provided signals). By collecting the reflected signals, the input impedance of the pins may be characterized along with other single port testing quantities. In other test scenarios, a digital signal may be sent over conductor 60 to pin 62 for storing a digital value on DUT 58. Once stored, DUT 58 may be accessed to retrieve and send the stored digital value over conductor 60 to tester 52. The retrieved digital value may then be identified to determine if the proper value was stored on DUT 58.

Along with performing single port measurements, a two-port or multi-port test may also be performed by tester 52. For example, a test signal may be injected over conductor 60 into pin 62 and a response signal may be collected from one or more other pins of DUT 58. This response signal may be provided to tester 52 to determine quantities, such as gain response, phase response, and other throughput measurement quantities. Other tests may also be performed.

While this specification describes example implementations related to "testing" and a "test system," the devices and method described herein may be used in any appropriate system, and are not limited to test systems or to the example test systems described herein.

Testing performed as described herein may be implemented using hardware or a combination of hardware and software. For example, a test system like the ones described herein may include various controllers and/or processing devices located at various points. A central computer may coordinate operation among the various controllers or processing devices. The central computer, controllers, and processing devices may execute various software routines to effect control and coordination of testing and calibration.

Testing can be controlled, at least in part, using one or more computer program products, e.g., one or more computer program tangibly embodied in one or more information carriers, such as one or more non-transitory machine-readable media, for execution by, or to control the operation of, one or more data processing apparatus, e.g., a programmable processor, a computer, multiple computers, and/or programmable logic components.

A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a network.

Actions associated with implementing all or part of the testing and calibration can be performed by one or more programmable processors executing one or more computer programs to perform the functions described herein. All or part of the testing and calibration can be implemented using special purpose logic circuitry, e.g., an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only storage area or a random access storage area or both. Elements of a computer (including a server) include one or more processors for executing instructions and one or more storage area devices for storing instructions and data. Generally, a computer will also include, or be operatively coupled to receive data from, or transfer data to, or both, one or more machine-readable storage media, such as mass PCBs for storing data, e.g., magnetic, magneto-optical disks, or optical disks. Machine-readable storage media suitable for embodying computer program instructions and data include all forms of non-volatile storage area, including by way of example, semiconductor storage area devices, e.g., EPROM, EEPROM, and flash storage area devices; magnetic disks, e.g., internal hard disks or removable disks; magneto-optical disks; and CD-ROM and DVD-ROM disks.

Any "electrical connection" as used herein may imply a direct physical connection or a connection that includes intervening components but that nevertheless allows electrical signals (including wireless signals) to flow between connected components. Any "connection" involving electrical circuitry mentioned herein, unless stated otherwise, is an electrical connection and not necessarily a direct physical connection regardless of whether the word "electrical" is used to modify "connection".

Elements of different implementations described herein may be combined to form other embodiments not specifically set forth above. Elements may be left out of the structures described herein without adversely affecting their operation. Furthermore, various separate elements may be combined into one or more individual elements to perform the functions described herein.

What is claimed is:

1. Automatic test equipment (ATE) comprising:
   a device interface board (DIB) on which a device under test (DUT) is mounted;
   a system for sending signals to, and receiving signals from, the DUT; and
   an energy source unit (ESU) to provide current to the DUT via the DIB, the ESU comprising current paths, the current paths being configured to limit a combined inductance of the current paths;
   wherein the current paths comprise a first circuit path and a second circuit path, the first circuit path for passing first current resulting in a first magnetic field and the second circuit path for passing second current resulting in a second magnetic field that at least partially cancels the first magnetic field, the first circuit path comprising first conductive planes and the second circuit path comprising second conductive planes, the first conductive planes being interleaved with the second conductive planes, each of the first conductive planes for passing part of the first current, and each of the second conductive planes for passing part of the second current; and wherein the first conductive planes are interrupted by a gap along the first circuit path for protection against current flow that exceeds a set value.

2. The ATE of claim 1, wherein the first current is substantially equal in magnitude, and opposite in direction, to the second current.

3. The ATE of claim 1, wherein the ESU is located directly below the DIB.

4. The ATE of claim 1, wherein the ESU is located below the DIB, and in a position that reduces inductance in the current paths without having an adverse impact on testing performed on the DUT.

5. The ATE of claim 1, wherein the second magnetic field cancels the first magnetic field.

6. The ATE of claim 1, further comprising a quick disconnect (QD) between the ESU and the DIB, the QD for disengaging the ESU from the DIB, the QD forming at least part of an electrical connection between the DUT and the ESU, the QD comprising a third circuit path and a fourth circuit path, the third circuit path for passing third current resulting in a third magnetic field and the fourth circuit path for passing fourth current resulting in a fourth magnetic field that at least partially cancels the third magnetic field.

7. The ATE of claim 1, wherein the ESU comprises:
one or more capacitors for providing current to the DUT; and
switches, arranged in parallel, between the one or more capacitors and the DIB, the switches being configured to open in response to a current that exceeds the set value.

8. The ATE of claim 7, wherein the switches comprise multiple solid state switches configured to achieve an inductance below a specified value.

9. The ATE of claim 7, wherein the switches breach the gap so as to pass current between different portions of the first conductive planes.

10. The ATE of claim 7, wherein the switches are at least greater than a predetermined distance from the one or more capacitors.

11. An apparatus for interfacing between automatic test equipment (ATE) and a device under test (DUT), the apparatus comprising:
a device interface board (DIB) on which the DUT is mounted; and
an energy source unit (ESU) to provide current to the DUT, the ESU comprising a circuit board that forms at least part of an electrical connection between the DUT and the ESU, the circuit board comprising a first circuit path and a second circuit path, the first circuit path for passing first current resulting in a first magnetic field and the second circuit path for passing second current resulting in a second magnetic field that at least partially cancels the first magnetic field;
wherein the first circuit path comprises first conductive planes and the second circuit path comprises second conductive planes, the first conductive planes being interleaved with the second conductive planes, each of the first conductive planes for passing part of the first current, and each of the second conductive planes for passing part of the second current; and
wherein the first conductive planes are interrupted by a gap along the first circuit path for protection against current flow that exceeds a set value.

12. The apparatus of claim 11, wherein the first current is substantially equal in magnitude, and opposite in direction, to the second current.

13. The apparatus of claim 11, wherein the ESU is located directly below the DIB relative to the DUT.

14. The apparatus of claim 11, wherein the ESU is located below the DIB, and in a position that reduces inductance in the first path without having an adverse impact on testing performed on the DUT.

15. The apparatus of claim 11, wherein each one of at least some of the first conductive planes is arranged between two second conductive planes.

16. The apparatus of claim 11, further comprising a quick disconnect (QD) between the ESU and the DIB, the QD for disengaging the ESU from the DIB, the QD forming at least part of the electrical connection between the DUT and the ESU, the QD comprising a third circuit path and a fourth circuit path, the third circuit path for passing third current resulting in a third magnetic field and the fourth circuit path for passing fourth current resulting in a fourth magnetic field that at least partially cancels the third magnetic field.

17. The apparatus of claim 11, wherein the ESU comprises:
one or more capacitors for providing current to the DUT; and
switches, arranged in parallel, between the one or more capacitors and the DUT, the switches being configured to open in response to a current that exceeds the set value.

18. The apparatus of claim 17, wherein the switches comprise multiple solid state switches configured to achieve an inductance below a specified value.

19. The apparatus of claim 17, wherein the switches breach the gap so as to pass current between different portions of the first conductive planes.

20. The apparatus of claim 17, wherein the switches are at least greater than a predetermined distance from the one or more capacitors.

* * * * *